(12) United States Patent
Lee et al.

(10) Patent No.: US 9,437,844 B2
(45) Date of Patent: Sep. 6, 2016

(54) DISPLAY DEVICE AND METHOD FOR MANUFACTURING THE SAME

(71) Applicant: SAMSUNG DISPLAY CO., LTD., Yongin, Gyeonggi-Do (KR)

(72) Inventors: Seong-Min Lee, Asan-si (KR); Sun-Hwa Kim, Hwaseong-si (KR); Hyun-Shik Lee, Incheon (KR); Hyo-min Kim, Incheon (KR); Hyuk-Sang Jun, Suwon-si (KR); Ju-kyung Jo, Asan-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/505,560

(22) Filed: Oct. 3, 2014

(65) Prior Publication Data

US 2015/0243704 A1  Aug. 27, 2015

(30) Foreign Application Priority Data

Feb. 24, 2014  (KR) .......................... 10-2014-0021393

(51) Int. Cl.
*H01L 23/52* (2006.01)
*H01L 51/56* (2006.01)
*H01L 51/52* (2006.01)
*H01L 27/32* (2006.01)

(52) U.S. Cl.
CPC ........... *H01L 51/56* (2013.01); *H01L 27/3246* (2013.01); *H01L 27/3279* (2013.01); *H01L 51/5271* (2013.01)

(58) Field of Classification Search
CPC ........... H01L 27/3244; H01L 27/3246; H01L 27/3248; H01L 51/50; H01L 51/5228; H01L 51/5234; H01L 51/5237; H01L 51/5243; H01L 51/5253; H01L 51/5259
USPC ........................................................ 257/211
See application file for complete search history.

(56) References Cited

U.S. PATENT DOCUMENTS

| 7,629,739 | B2 * | 12/2009 | Han et al. ...................... 313/504 |
| 8,367,278 | B2 * | 2/2013 | Kwon ...................... G03F 1/144 430/5 |
| 2011/0227875 | A1 * | 9/2011 | Chung .......................... 345/175 |
| 2012/0211754 | A1 | 8/2012 | Park |
| 2013/0134474 | A1 * | 5/2013 | Takeuchi et al. ................ 257/99 |
| 2013/0140529 | A1 * | 6/2013 | Seong et al. ..................... 257/40 |
| 2013/0140597 | A1 | 6/2013 | Kim et al. |

FOREIGN PATENT DOCUMENTS

| KR | 10-2008-0057992 A | 6/2008 |
| KR | 10-2012-0095197 A | 8/2012 |
| KR | 10-2012-0122534 A | 11/2012 |
| KR | 10-2013-0063077 A | 6/2013 |

* cited by examiner

*Primary Examiner* — Reema Patel
*Assistant Examiner* — Syed Gheyas
(74) *Attorney, Agent, or Firm* — Lee & Morse, P.C.

(57) ABSTRACT

A display device includes a substrate, a first electrode on the substrate, a pixel defining layer on the substrate, the pixel defining layer having an opening exposing the first electrode, a metal layer on the pixel defining layer, a light emission layer on the first electrode exposed by the opening, and a second electrode on the light emission layer in the opening. The metal layer contacts the second electrode.

20 Claims, 8 Drawing Sheets

DISPLAY DEVICE AND METHOD FOR MANUFACTURING THE SAME

CROSS-REFERENCE TO RELATED APPLICATION

Korean Patent Application No. 10-2014-0021393, filed on Feb. 24, 2014, in the Korean Intellectual Property Office, and entitled: "Display Device And Method For Manufacturing The Same," is incorporated by reference herein in its entirety.

BACKGROUND

1. Field

Embodiments relate to a display device and a manufacturing method thereof.

2. Description of the Related Art

Flat panel displays such as liquid crystal displays (LCDs) and organic light emitting diode (OLED) displays generally include a plurality of pairs of electric field generating electrodes and an electro-optical active layer interposed therebetween. In a LCD, a liquid crystal layer is included as the electro-optical active layer. In an OLED display, an organic light emitting layer is included as the electro-optical active layer. One of a pair of electric field generating electrodes is generally connected to a switching element so as to receive an electric signal. The electro-optical active layer converts the electric signal into an optical signal so that an image is displayed. There has been a growing interest in an OLED display that is self-emissive, requiring no separate light source, and that has relatively excellent luminance, contrast ratio, viewing angle, and the like.

SUMMARY

Embodiments are directed to a display device including a substrate, a first electrode on the substrate, a pixel defining layer on the substrate, the pixel defining layer having an opening exposing the first electrode, a metal layer on the pixel defining layer, a light emission layer on the first electrode exposed by the opening, and a second electrode on the light emission layer in the opening. The metal layer contacts the second electrode.

The display device may further include a dielectric layer on the metal layer. The dielectric layer may include at least one of lithium fluoride (LiF), tungsten trioxide ($WO_3$), titanium dioxide ($TiO_2$), aluminum oxide ($Al_2O_3$), zinc oxide (ZnO), zinc sulfide (ZnS), and silver oxide (AgO). The dielectric layer may include a same material as the pixel defining layer. The dielectric layer may have a refractive index of about 1 to about 5. The dielectric layer may be on the second electrode.

The pixel defining layer may include a protrusion. The metal layer may cover at least one of a top surface and side surfaces of the protrusion. The metal layer may include at least one of chromium (Cr), molybdenum (Mo), silver (Ag), aluminum (Al), gold (Au), and copper (Cu).

A method of manufacturing a display device includes: forming a first electrode on a substrate; forming a pixel defining layer on the substrate, the pixel defining layer having an opening exposing the first electrode; forming a metal layer on the pixel defining layer; forming a light emission layer on the first electrode exposed by the opening; and forming a second electrode on the light emission layer in the opening. The second electrode contacts the metal layer.

Forming the pixel defining layer and the metal layer may include: coating a photosensitive organic material onto the substrate and the first electrode; coating a photosensitive metal material onto the photosensitive organic material; exposing the photosensitive organic material and the photosensitive metal material to light using a mask; forming the pixel defining layer and the opening exposing the first electrode and by developing the exposed photosensitive organic material and photosensitive metal material; and forming the metal layer by heat treating the photosensitive metal material. The heat treating may be performed at a temperature of about 200° C. to about 300° C.

The method may further include forming a dielectric layer on the metal layer. The method may further include forming a dielectric layer on the metal layer and the second electrode. Forming the pixel defining layer, the metal layer, and the dielectric layer may include: coating a first photosensitive organic material onto the substrate and the first electrode; coating a photosensitive metal material onto the first photosensitive organic material; coating a second photosensitive organic material onto the photosensitive metal material; exposing the first photosensitive organic material, the photosensitive metal material, and the second photosensitive organic material to light using a mask; developing the exposed first photosensitive organic material, photosensitive metal material, and second photosensitive organic material to form the pixel defining layer, the dielectric layer, and the opening exposing the first electrode; and forming the metal layer by heat treating the photosensitive metal material.

The dielectric layer may include at least one of lithium fluoride (LiF), tungsten trioxide ($WO_3$), titanium dioxide ($TiO_2$), aluminum oxide ($Al_2O_3$), zinc oxide (ZnO), zinc sulfide (ZnS), and silver oxide (AgO). The dielectric layer may include a same material as the pixel defining layer. The metal layer may include at least one of chromium (Cr), molybdenum (Mo), silver (Ag), aluminum (Al), gold (Au), and copper (Cu).

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Figure 1:
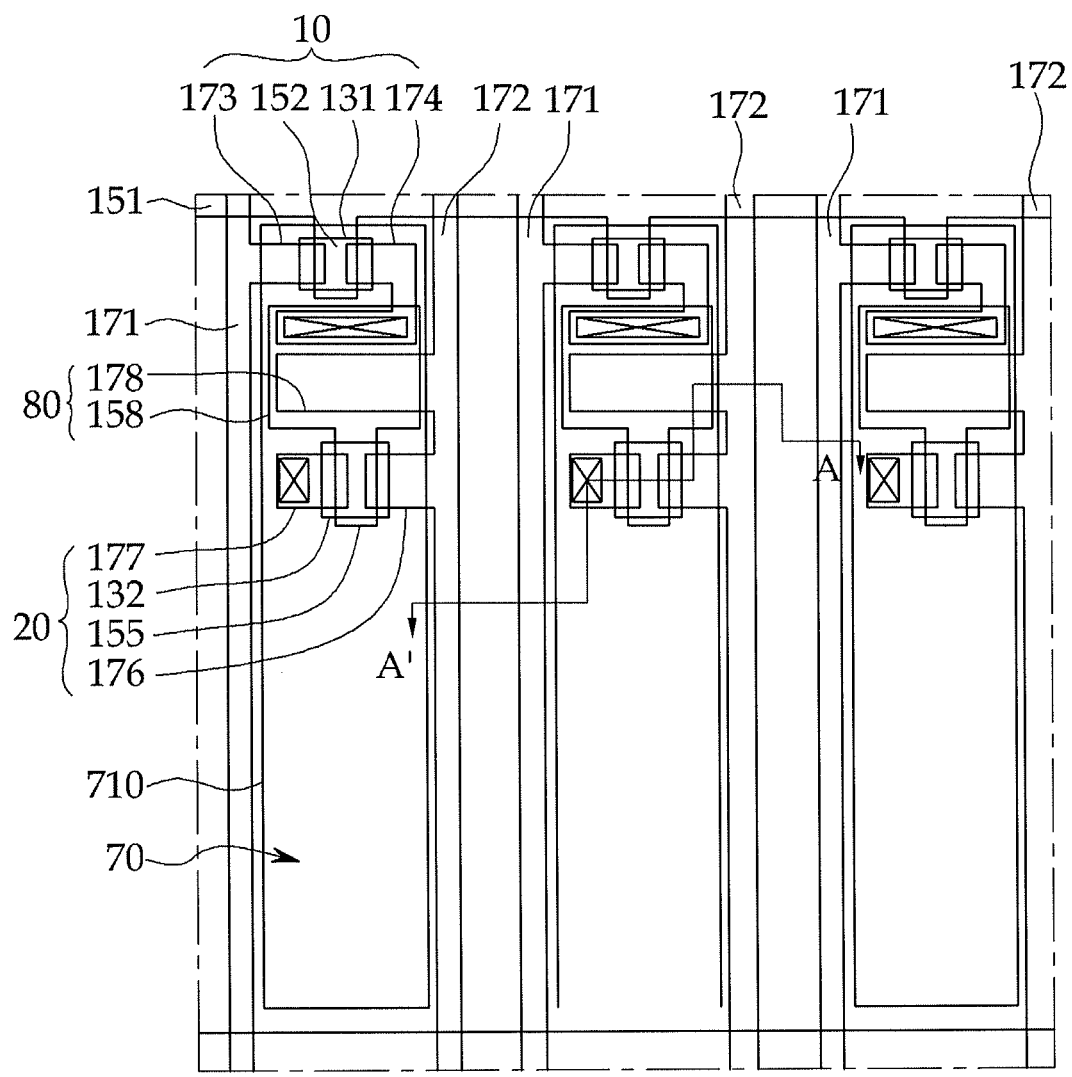
FIG. 1 illustrates a plan view of a display device.

Example embodiments will now be described more fully hereinafter with reference to the accompanying drawings; however, they may be embodied in different forms and should not be construed as limited to the embodiments set forth herein. Rather, these embodiments are provided so that this disclosure is thorough and complete, and will fully convey exemplary implementations to those skilled in the art. In the drawing figures, the dimensions of layers and regions may be exaggerated for clarity of illustration. Like reference numerals refer to like elements throughout the specification The spatially relative terms "below," "beneath," "lower," "above," "upper," and the like, may be used herein for ease of description to describe the relations between one element or component and another element or component as illustrated in the drawings. The spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and is not construed as limiting. The singular forms "a," "an," and "the" include the plural forms as well, unless the context clearly indicates otherwise. The terms "comprises" and/or "comprising," specify the presence of mentioned component, step, operation and/or element, but do not exclude the presence or addition of one or more other components, steps, operations, and/or elements. Unless otherwise defined, all terms used herein (including technical and scientific terms) have the same meaning as commonly understood by those skilled in the art. Terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
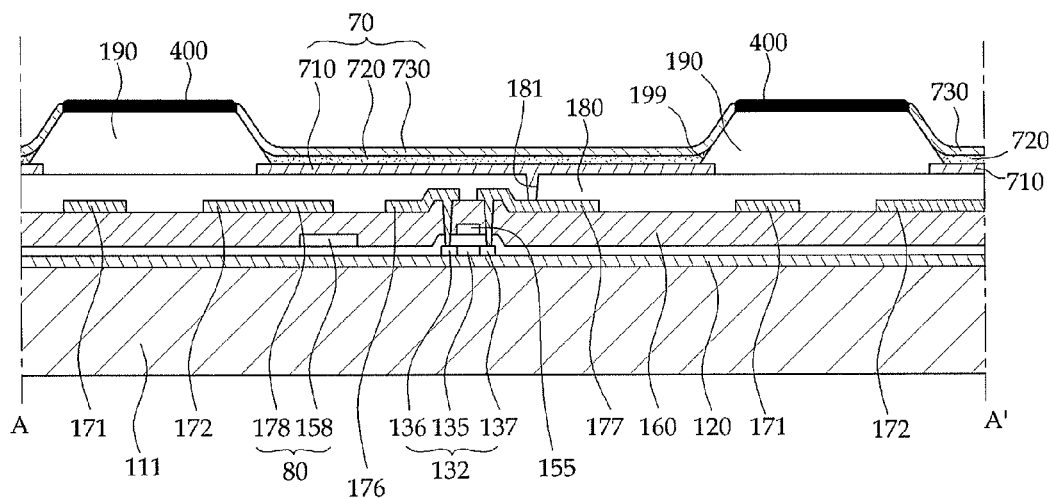
FIG. 2 illustrates a cross-sectional view taken along line A-A' of FIG. 1.

A display device according to an embodiment is described with reference to FIGS. 1 and 2. The display device may be an organic light emitting diode (OLED) display or a liquid crystal display (LCD). The display device is described, for example, as an OLED display. FIG. 1 illustrates a plan view of a display device according to an embodiment. FIG. 2 illustrates a cross-sectional view taken along line A-A' of FIG. 1, according to a first embodiment. For example, FIGS. 1 and 2 illustrate an active-matrix OLED display with a 2Tr-1Cap structure in which two thin film transistors (TFTs) 10 and 20 and one capacitor 80 are included in each pixel of a display area. The number and type of components may be varied. An OLED display according to one embodiment may include three or more TFTs and two or more capacitors in one pixel, and may further include separate lines. The OLED display may have various different structures. The term "pixel" refers to the smallest unit to display an image, and the display area displays an image by using a plurality of pixels.

Referring to FIGS. 1 and 2, an OLED display 100 includes a substrate 111, and a switching TFT 10, a driving TFT 20, a capacitor 80 and an organic light emitting diode (OLED) 70, which are disposed in each pixel defined on the substrate 111. The substrate 111 includes a gate line 151 arranged along one direction, a data line 171 insulated from and intersecting the gate line 151, and a common power line 172. Each pixel may be defined, for example, by the gate line 151, the data line 171, and the common power line 172.

The OLED 70 may include a pixel electrode 710, an organic emission layer 720 on the pixel electrode 710, and a common electrode 730 on the organic emission layer 720. One or more pixel electrodes 710 may be disposed in each pixel. The substrate 111 may include a plurality of pixel electrodes 710 that are spaced apart from each other.

The pixel electrode 710, for example, may serve as an anode that is a hole injection electrode, and the common electrode 730, for example, may serve as a cathode that is an electron injection electrode. Other electrode designs may be used. For example, the pixel electrode 710 may serve as a cathode and the common electrode 730 may serve as an anode according to a method of driving an OLED display. A hole and an electron injected into the organic emission layer 720 are combined with each other to form an exciton, and light emission occurs when the exciton falls from an excited state to a ground state.

The capacitor 80 may include a pair of storage electrodes 158 and 178 with an insulating layer 160 interposed between the storage electrodes 158 and 178. The insulating layer 160 may be, for example, a dielectric material. Capacitance of the capacitor 80 may be determined by electric charges stored in the capacitor 80 and voltage between the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. The switching TFT 10 may act as a switching element that selects a pixel to emit light. The switching gate electrode 152 may be connected to the gate line 151. The switching source electrode 173 may be connected to the data line 171. The switching drain electrode 174 may be spaced apart from the switching source electrode 173 and connected to the (first) storage electrode 158.

The driving TFT 20 may apply driving power, which allows the organic emission layer 720 of the OLED 70 in the selected pixel to emit light to the pixel electrode 710. The driving gate electrode 155 may be connected to the first storage electrode 158 connected to the switching drain electrode 174. The driving source electrode 176 and the second storage electrode 178 may be connected to the common power line 172. The driving drain electrode 177 may be connected to the pixel electrode 710 of the OLED 70 through a drain contact hole 181.

The switching TFT 10 may be operated by a gate voltage applied to the gate line 151 and may serve to transmit a data voltage applied to the data line 171 to the driving TFT 20. A voltage equivalent to a differential between a common voltage may be applied to the driving TFT 20 from the common power line 172. The data voltage transmitted from the switching TFT 10 may be stored in the capacitor 80. A current corresponding to the voltage may be stored in the capacitor 80 flows to the OLED 70 through the driving TFT 20, so that the OLED 70 may emit light.

According to a first embodiment, a configuration of a display device is described with reference to FIGS. 1 and 2. FIG. 2 illustrates an OLED 70, a driving TFT 20, a capacitor 80, a data line 171, and a common power line 172. A switching semiconductor layer 131, a switching gate electrode 152, a switching source electrode 173, and a switching drain electrode 174 of a switching TFT 10 may be respectively identical to a driving semiconductor layer 132, a driving gate electrode 155, a driving source electrode 176, and a driving drain electrode 177 of a driving TFT 20 with respect to a laminated structure.

A substrate 111 may be, for example, an insulating substrate made of glass, quartz, ceramic, plastic, or the like. Other substrate materials may be used. In other implementations, the substrate 111 may be a metal substrate made of stainless steel, or the like. A buffer layer 120 may be on the substrate 111. The buffer layer 120 may prevent infiltration of undesirable elements such as impurities and moisture, and planarize a surface, and may include many different materials. For example, the buffer layer 120 may include at least one selected from silicon nitride ($SiN_x$), silicon oxide ($SiO_2$), and silicon oxynitride ($SiO_xN_y$). The buffer layer 120 need not always be present, and may be omitted depending on the types and process conditions of the substrate 111.

The driving semiconductor layer 132 may be disposed on the buffer layer 120. The driving semiconductor layer 132 may include at least one semiconductor material selected from polycrystalline silicon, amorphous silicon, and oxide semiconductors. The driving semiconductor layer 132 may include a channel area 135 that is not doped with impurities, and p+ doped source and drain areas 136 and 137 on the respective sides of the channel area 135. P-type impurities such as boron B may be used as dopant ions. For example, $B_2H_6$ may be used. Such impurities may vary depending on the kinds of thin film transistors (TFTs).

A gate insulating layer 140 including silicon nitride (SiNx) or silicon oxide ($SiO_2$) may be on the driving semiconductor layer 132. The gate insulating layer 140 may include at least one selected from tetraethyl orthosilicate (TEOS), silicon nitride ($SiN_x$), and silicon oxide ($SiO_2$). For example, the gate insulating layer 140 may have a double layer structure in which a silicon nitride layer having a thickness of about 40 nm and a TEOS layer having a thickness of about 80 nm are sequentially laminated. Other materials and/or thicknesses may be used.

The driving gate electrode 155, a gate line (see reference numeral 151 of FIG. 1), and a first storage electrode 158 may be on the gate insulating layer 140. The driving gate electrode 155 may overlap at least a part of the driving semiconductor layer 132, for example, the channel area 135. The driving gate electrode 155 may prevent the channel area 135 from being doped with impurities, for example, when the source and drain areas 136 and 137 of the driving semiconductor layer 132 are doped with the impurities in the process of forming the driving semiconductor layer 132. The driving gate electrode 155 and the first storage electrode 158 may be disposed on the same layer, and may substantially include the same metal material. The metal material may include at least one selected from molybdenum (Mo), chromium (Cr), and tungsten (W). For example, the driving gate electrode 155 and the first storage electrode 158 may include molybdenum (Mo) or a molybdenum-base alloy.

An insulating layer 160 covering the driving gate electrode 155 may be disposed on the gate insulating layer 140. The insulating layer 160 may be an interlayer insulating layer. The insulating layer 160 may include silicon nitride ($SiN_x$), or silicon oxide ($SiO_x$) like the gate insulating layer 140. The gate insulating layer 140 and the insulating layer 160 may include a contact hole to expose the source and drain areas 136 and 137 of the driving semiconductor layer 132.

The driving source electrode 176, the driving drain electrode 177, the data line 171, the common power line 172, and a second storage electrode 178 may be on the insulating layer 160 in a display area DA. The driving source electrode 176 and the driving drain electrode 177 may be respectively connected to the source and drain areas 136 and 137 of the driving semiconductor layer 132 through the contact hole.

The driving source electrode 176, the driving drain electrode 177, the data line 171, the common power line 172, and the second storage electrode 178 may include at least one refractory metal selected from molybdenum, chromium, tantalum and titanium, or alloys thereof, and may have a multilayer structure that includes a refractory metal layer and a low resistance conductive layer. Examples of the multilayer structure may include a double layer including chromium or molybdenum (an alloy thereof) lower layer and an aluminum (an alloy thereof) upper layer, and/or a triple layer include a molybdenum (an alloy thereof) lower layer, an aluminum (an alloy thereof) intermediate layer, and a molybdenum (an alloy thereof) upper layer. The driving source electrode 176, the driving drain electrode 177, the data line 171, the common power line 172, and the second storage electrode 178 may include various conductive materials besides the above-described materials. The driving TFT 20 including the driving semiconductor layer 132, the driving gate electrode 155, the driving source electrode 176, and the driving drain electrode 177 may be formed as described herein. Other configurations of and method of manufacturing the driving TFT 20 may be used.

A protective layer 180 covering the driving source electrode 176, the driving drain electrode 177, and the like may be on the insulating layer 160. The protective layer 180 may include an organic material such as a polyacryl, a polyimide, or the like. The protective layer 180 may be a planarization layer. The protective layer 180 may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB). The protective layer 180 may include a drain contact hole 181 exposing the driving drain electrode 177.

A pixel electrode 710 may be on the protective layer 180. The pixel electrode 710 may be connected to the driving drain electrode 177 through the drain contact hole 181 of the protective layer 180. A pixel defining layer 190 covering the pixel electrode 710 may be on the protective layer 180. The pixel defining layer 190 may include an opening 199 exposing the pixel electrode 710. The pixel electrode 710 may correspond to the opening 199 of the pixel defining layer 190. The pixel defining layer 190 may include a polyacrylate resin, a polyimide resin, or the like. The pixel defining layer 190 may include a photosensitive organic material or a photosensitive polymer material. For example, the pixel defining layer 190 may include one or more of a polyacrylate, a polyimide, a photosensitive polyimide (PSPI), a photosensitive acryl (PA), and a photosensitive novolak resin.

A metal layer 400 may be on the pixel defining layer 190. The metal layer 400 may absorb ambient light incident onto the pixel defining layer 190. The metal layer 400 may prevent the ambient light from being incident onto the TFTs 10 and 20. When an OLED display 100 is a top emission device, for example, the metal layer 400 may also absorb ambient light reflected from the pixel electrode 710 provided as a reflective electrode. In addition, the metal layer 400 may absorb ambient light reflected from a component of the substrate 111 under the pixel defining layer 190. The metal layer 400 may absorb ambient light passing through the pixel defining layer 190, thereby improving outdoor visibility. The metal layer 400 may includes at least one of chromium (Cr), molybdenum (Mo), silver (Ag), aluminum (Al), gold (Au), and copper (Cu). The metal layer 400 may contact a common electrode 730 corresponding to a second electrode. The metal layer 400 may contact the common electrode 730, thereby preventing voltage drop (IR drop) in the common electrode 730.

An organic emission layer 720 may be on the pixel electrode 710 in the opening 199 of the pixel defining layer 190, and the common electrode 730 may be on the pixel defining layer 190 and the organic emission layer 720. The OLED 70 including the pixel electrode 710, the organic emission layer 720, and the common electrode 730 may be formed.

Any one of the pixel electrode 710 and the common electrode 730 may include a transparent conductive material, and the other may include a transflective or reflective conductive material. According to the kinds of materials included in the pixel electrode 710 and the common electrode 730, the OLED display 100 may be classified into three types: a top-emission type, a bottom-emission type, and a dual-emission type. The transparent conductive material may include, for example, at least one selected from indium tin oxide (ITO), indium zinc oxide (IZO), zinc oxide (ZnO), and indium oxide ($In_2O_3$). The reflective material may include at least one selected from lithium (Li), calcium (Ca), lithium fluoride/calcium (LiF/Ca), lithium fluoride/aluminum (LiF/Al), aluminum (Al), silver (Ag), magnesium (Mg), and gold (Au).

The organic emission layer 720 may include a low molecular weight organic material or a high molecular weight organic material. The organic emission layer 720 may be formed to be a multilayer including at least one of an light emission layer, a hole injection layer (HIL), a hole transporting layer (HTL), an electron transporting layer (ETL), and an electron injection layer (EIL). For example, the HIL may be on the pixel electrode 710 serving as an anode, and the HTL, the light emission layer, the ETL, and the EIL may be sequentially laminated on the HIL.

The organic emission layer 720 may be, for example, only in the opening 199 of the pixel defining layer 190. In other implementations, at least one layer of the organic emission layers 720 may be not only on the pixel electrode 710 in the opening 199 of the pixel defining layer 190, but also between the pixel defining layer 190 and the common electrode 730. The HIL, the HTL, the ETL, and the EIL of the organic emission layer 720 may also be on a part other than the opening 199 by using an open mask. The light emission layer of the organic emission layer 720 may be disposed, in each opening 199 using a fine metal mask (FMM).

When the display device is a liquid crystal display (LCD), the pixel electrode 710 may be physically and electrically connected to the driving drain electrode 177 through the drain contact hole 181, and may receive a data voltage from the driving drain electrode 177. An electric field may be generated by the pixel electrode 710 receiving the data voltage in conjunction with the common electrode receiving a common voltage, thereby determining a direction of liquid crystal molecules of a liquid crystal layer between the two electrodes. The pixel electrode 710 and the common electrode may form a capacitor (for example, a "liquid crystal capacitor") so as to maintain the applied voltage after a thin film transistor is turned off.

Figure 3A:
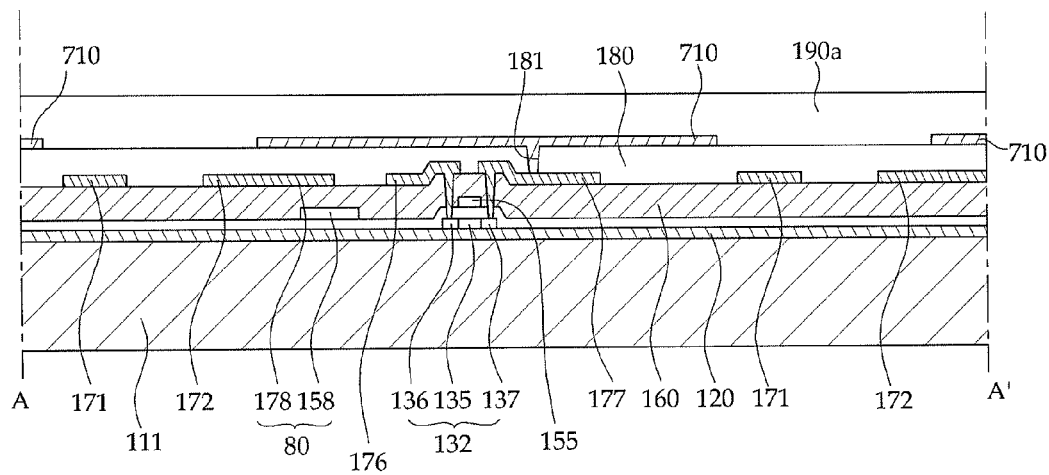
FIGS. 3A to 3G illustrate cross-sectional views of stages of a manufacturing method of a display device.

According to the first embodiment, a method of manufacturing the OLED display is described with reference to FIGS. 1 and 3A to 3G. FIGS. 3A to 3G illustrate cross-sectional views showing stages of a method of manufacturing a display device according to the first embodiment. As illustrated in FIGS. 1 and 3A, the driving TFT 20, the capacitor 80, the data line 171, the common power line 172, and the like may be formed on the substrate 111. The driving TFT 20, the capacitor 80, the data line 171, and the common power line 172 may be formed by etching. The planarization layer 180 may be formed on the data line 171, the common power line 172, the second storage electrode 178, the driving source electrode 176, and the driving drain electrode 177. The drain contact hole 181 may be formed in the planarization layer 180 to expose the driving drain electrode 177. The pixel electrode 710 may be formed on the planarization layer 180, and may be connected to the driving drain electrode 177 exposed through the drain contact hole 181. Until the forming of the pixel electrode 710, the display device according to this embodiment may be manufactured using any suitable method.

A photosensitive organic material 190a may be coated onto the pixel electrode 710 and the planarization layer 180. The photosensitive organic material 190a may include, for example, any one of a polyacrylate, a polyimide, a photosensitive polymide (PSPI), a photosensitive acryl (PA), and a photosensitive novolak resin. The photosensitive organic material 190a may be coated by deposition or the like. Next, a soft bake process may be performed. In the soft bake process, the photosensitive organic material 190a may be heat treated at a temperature of about 90° C. to about 110° C. for about one (1) minute. The photosensitive organic material 190a may be coated by being dissolved in a solvent and soft baked to evaporate the solvent.

Figure 3B:
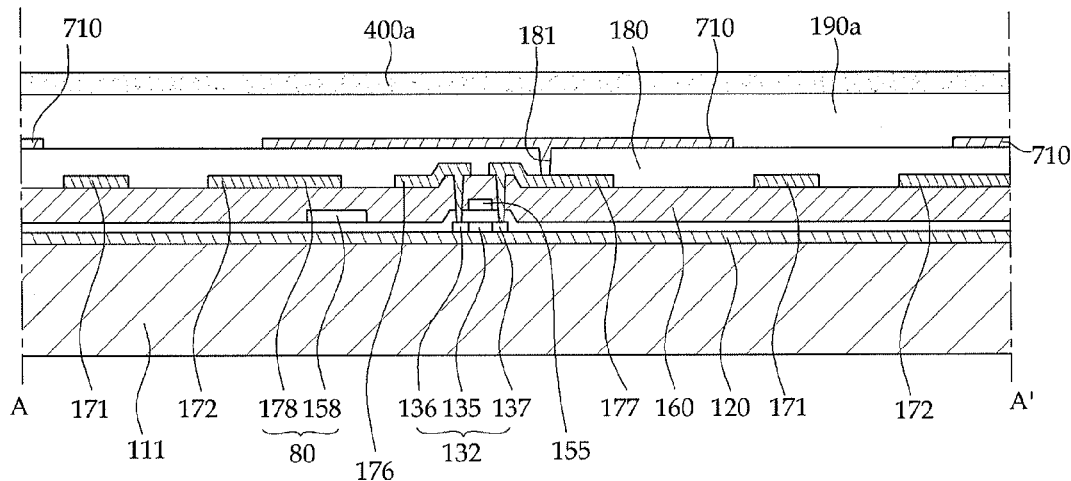

As illustrated in FIG. 3B, a photosensitive metal material 400a may be coated on the photosensitive organic material 190a. The photosensitive metal material 400a may be formed by screen printing, blade coating, spin coating, or the like. The photosensitive metal material 400a may be a viscous liquid including a metal particle, a binder, a dispersant (dispersing agent), an organic solvent (vehicle), and the like. The metal particle may include at least one of chromium (Cr), molybdenum (Mo), silver (Ag), aluminum (Al), gold (Au), and copper (Cu), which are capable of absorbing visible light. The organic solvent (vehicle) may be a material that reacts with a developer (developing solution) used to etch the photosensitive organic material 190a of the pixel defining layer 190.

Figure 3C:
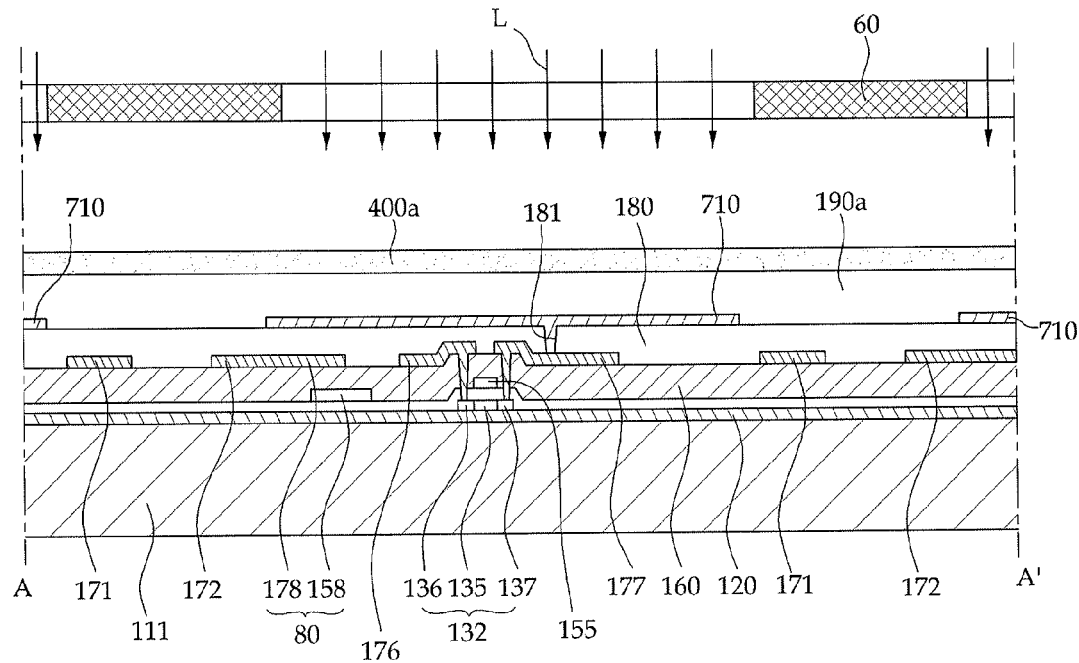

As illustrated in FIG. 3C, a mask 60 may be disposed on the photosensitive metal material 400a. The photosensitive organic material 190a and the photosensitive metal material 400a may be exposed to light L radiated from an exposure apparatus using the mask 60.

Figure 3D:
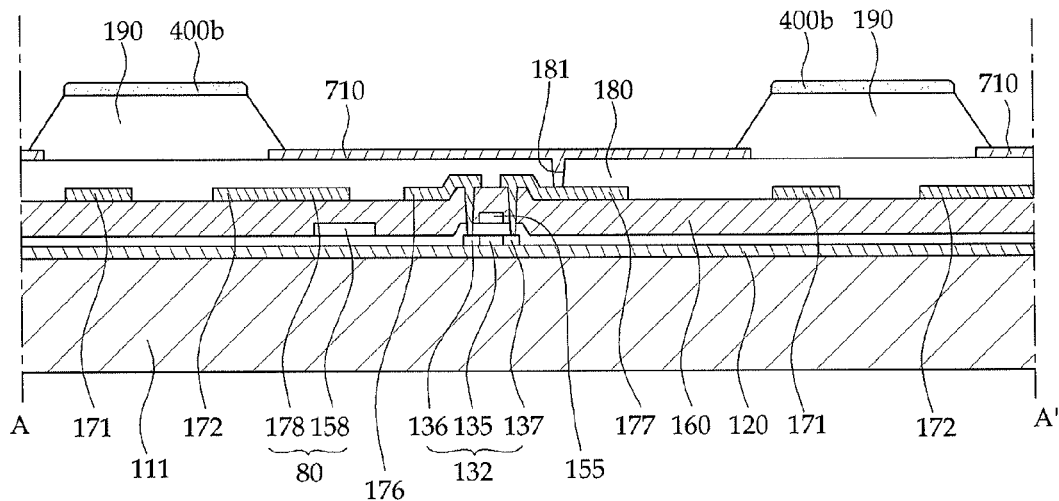

As illustrated in FIG. 3D, the coated photosensitive organic material 190a and photosensitive metal material 400a may be developed, and then patterned to be between the pixel electrodes 710. A developer (developing solution) reacting with both the photosensitive organic material 190a and the photosensitive metal material 400a may be used in the developing process. The photosensitive metal material 400a may be prepared using an organic solvent that is identical or similar to an organic solvent included in the photosensitive organic material 190a. Thus, the photosensitive organic material 190a and photosensitive metal material 400a may be simultaneously developed.

The photosensitive organic material 190a patterned in the process illustrated in FIG. 3D may be hard-baked to form the pixel defining layer 190. The hard bake may include a heat treatment process performed at a temperature of about 110° C. to about 130° C. A photosensitive polymer material may be heat cured by performing the hard bake. In other implementations, the hard bake may be replaced with curing A, as illustrated in FIG. 3E.

Figure 3E:
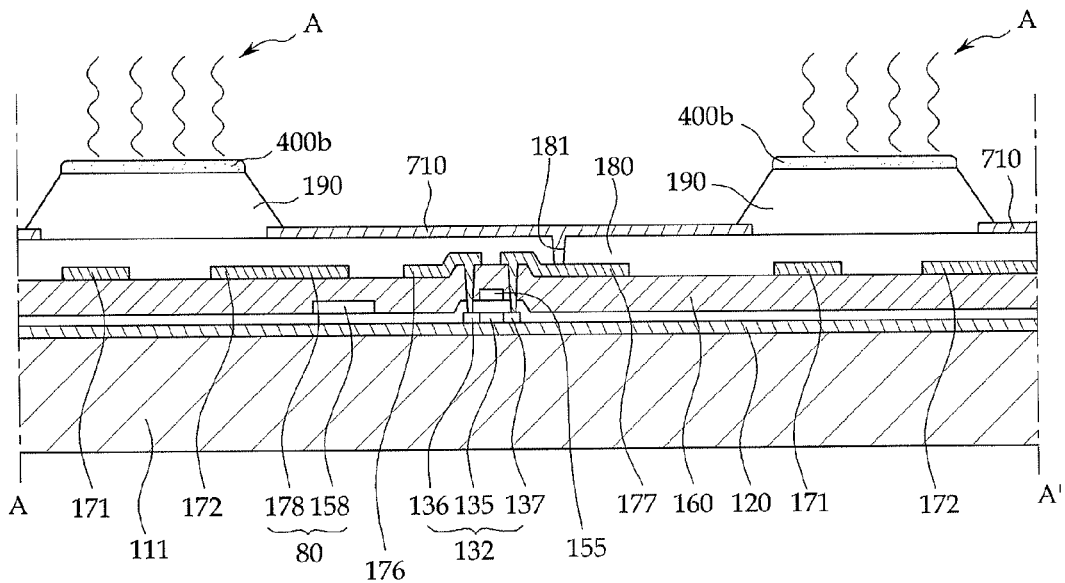

As illustrated in FIG. 3E, the developed photosensitive metal material 400b may be subjected to curing A. The curing A is a heat treatment process of a target material at atmospheric pressure. In the curing A, the organic solvent may be removed from the photosensitive metal material 400b such that the photosensitive metal material 400b is converted into a pure metal layer. The curing A may be performed in a temperature range in which organic materials included in the pixel defining layer 190 are not damaged. For example, the curing A may be performed at a temperature of about 200° C. to about 300° C., a range in which the pixel defining layer 190 is not damaged. The photosensitive metal material may include a low-temperature photosensitive metal paste in order to achieve plasticity at a temperature of about 200° C. to about 300° C. The curing A may also serve as a hard bake process in which the pixel defining layer 190 is heat cured. In the process of forming the pixel defining layer 190 and the metal layer 400, the soft bake, the hard bake, and the curing A may be all applied to the manufacturing method of a display device.

Figure 3F:
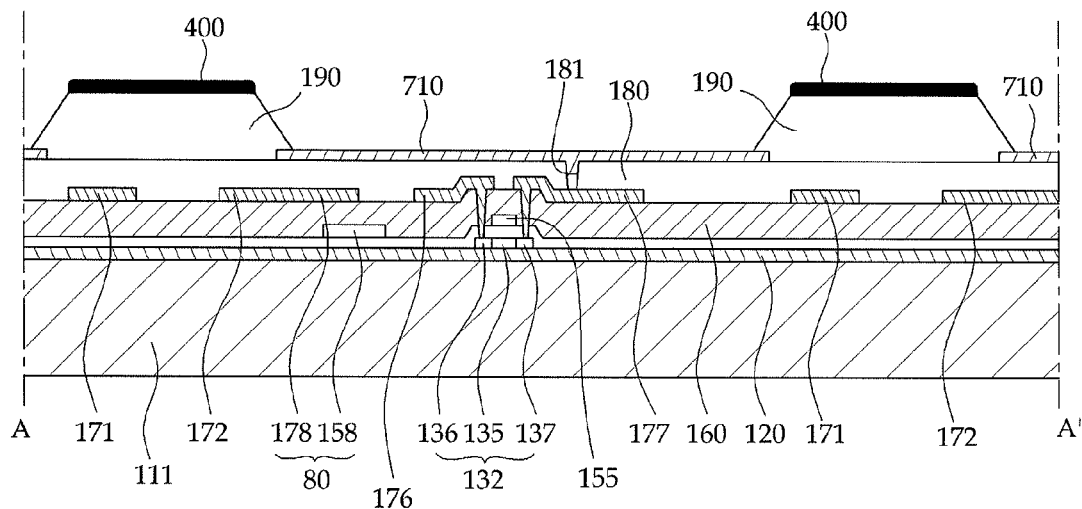

As illustrated in FIG. 3F, when the curing process is completed, the pixel defining layer 190 is then formed between the pixel electrodes 710. The metal layer 400 may be formed concurrently with the pixel defining layer 190, and further may be formed on the pixel defining layer 190. Therefore, no additional mask is necessary as the metal layer 400 may be formed concurrently with the pixel defining layer 190, thereby achieving enhanced process efficiency.

Figure 3G:
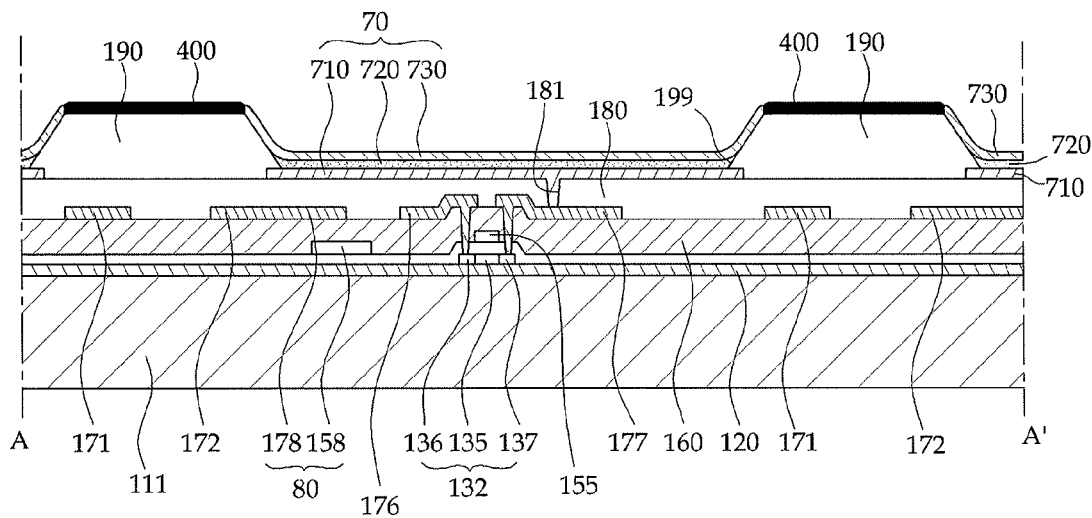

As illustrated in FIG. 3G, the organic emission layer 720 may be formed on the pixel electrode 710. The common electrode 730 may be formed on the organic emission layer 720. For example, the common electrode 730 may contact the metal layer 400 and be in the opening 199 of the pixel defining layer 190. Other configurations of the common electrode 730 may be used. For example, the common electrode 730 may be formed to cover all of the organic emission layer 720, the pixel defining layer 190, and the metal layer 400. The OLED display 100 according to embodiments may achieve improved outdoor visibility, due to the metal layer 400, reduced voltage drop of the common electrode 730, decreased power consumption, and enhanced luminance uniformity.

Figure 4:
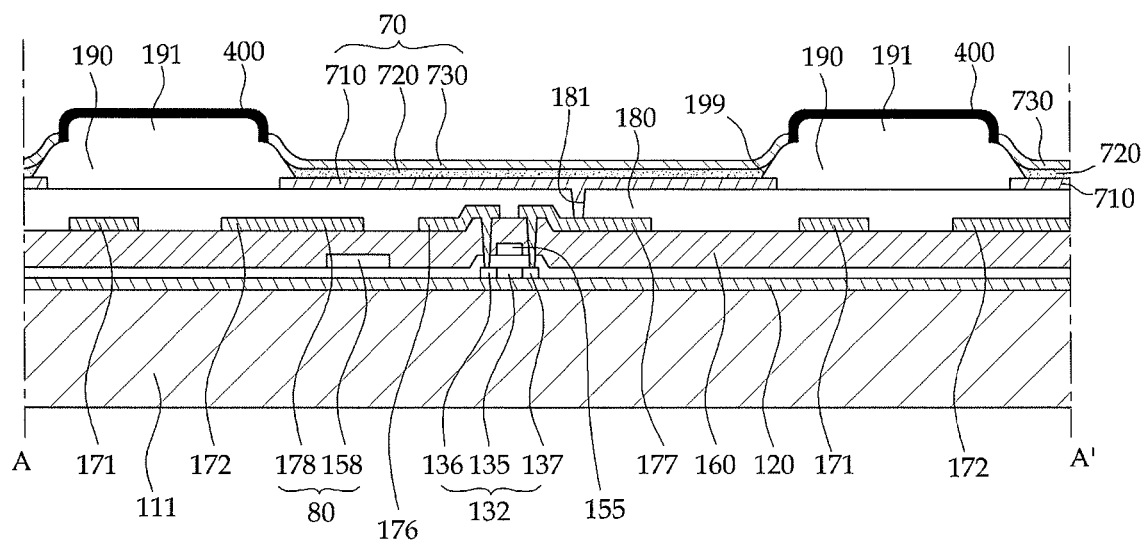
FIG. 4 illustrates a cross-sectional view taken along line A-A' of FIG. 1.
Figure 5:
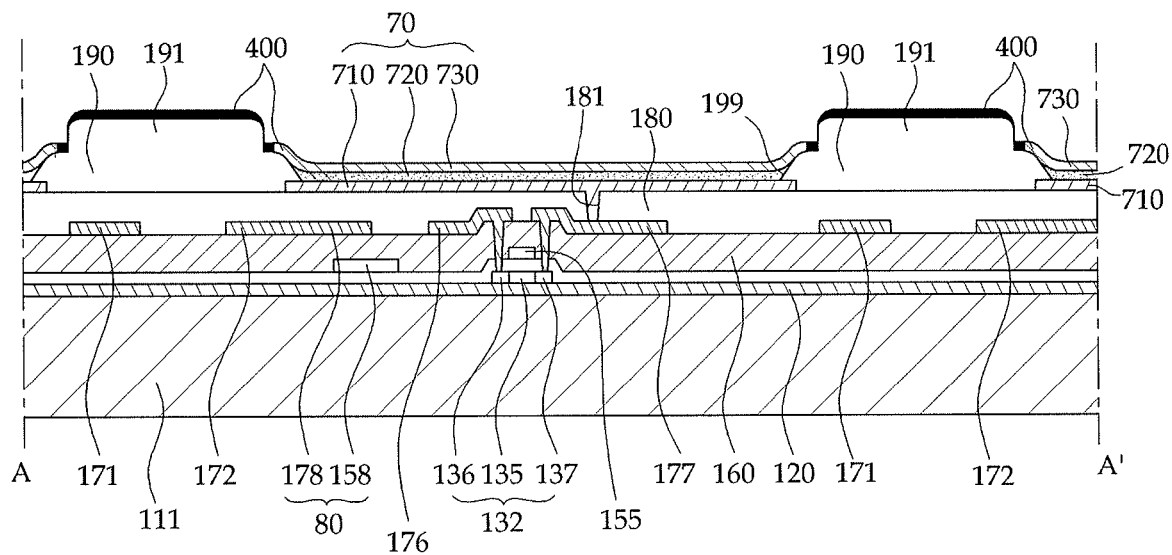
FIG. 5 illustrates a cross-sectional view taken along line A-A' of FIG. 1.

A display device according to additional embodiments is described with reference to FIGS. 4 and 5. FIG. 4 illustrates a cross-sectional view taken along line A-A' of FIG. 1, according to an embodiment. FIG. 5 illustrates a cross-sectional view taken along line A-A' of FIG. 1, according to another embodiment. Referring to FIGS. 4 and 5, a pixel defining layer 190 according to those embodiments may include a protrusion 191. According to the embodiment illustrated in FIG. 4, a metal layer 400 may cover a top surface and side surfaces of the protrusion 191 of the pixel defining layer 190.

According to the embodiment illustrated in FIG. 5, a metal layer 400 may cover, for example, only a top surface of the protrusion 191 of the pixel defining layer 190. In addition, the metal layer may be partly disposed on a top surface of the pixel defining layer 190 connected to side surfaces of the protrusion 191. According to those embodiments, the metal layer may be disposed on the pixel defining layer 190 having a variety of structures.

Figure 6:
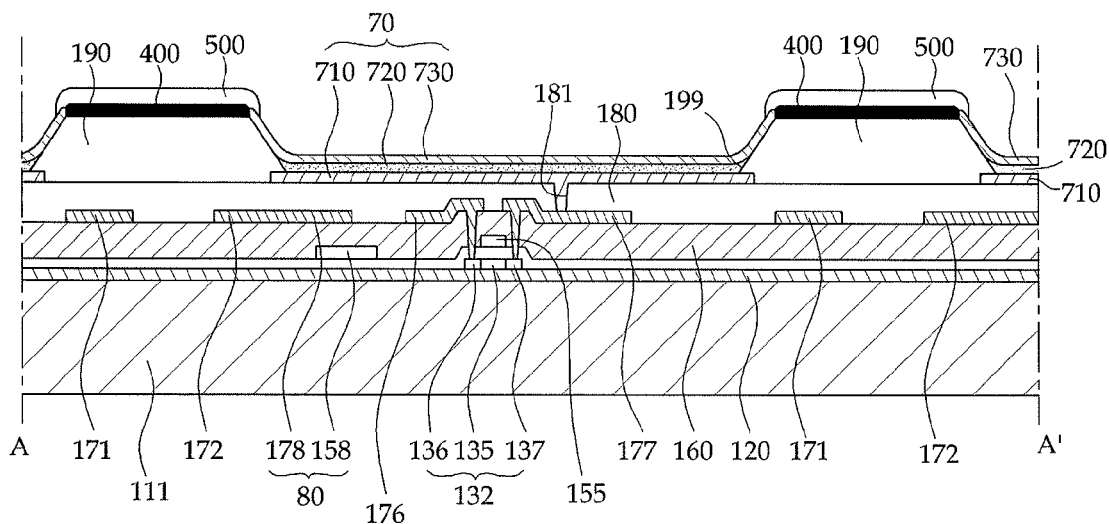
FIG. 6 illustrates a cross-sectional view taken along line A-A' of FIG. 1.
Figure 7:
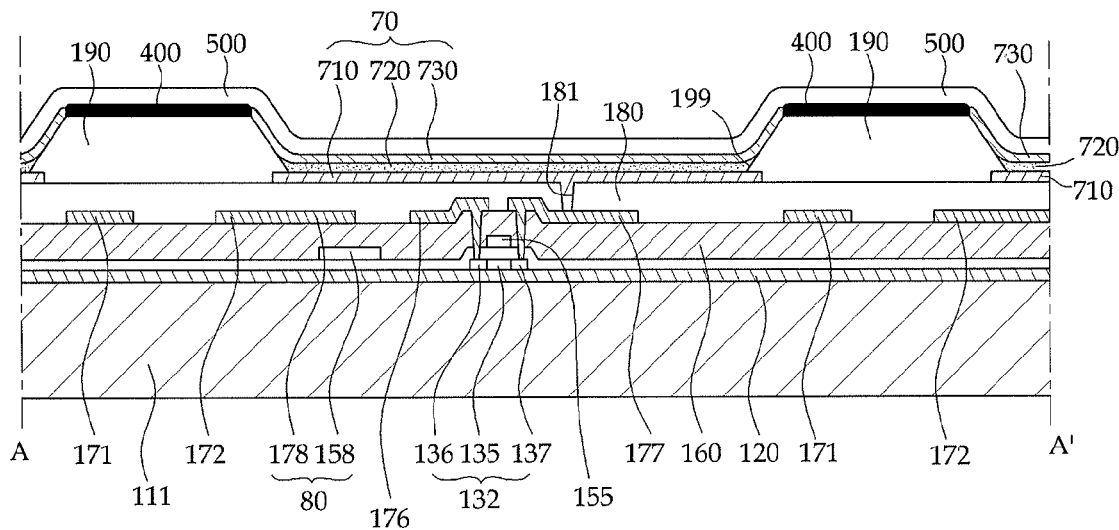
FIG. 7 illustrates a cross-sectional view taken along line A-A' of FIG. 1.
Figure 8:
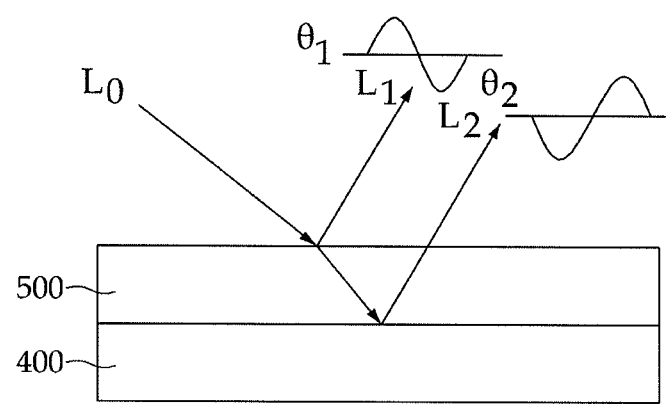
FIG. 8 is a schematic diagram illustrating a principle of reducing ambient light reflection by using an effect of destructive interference by phase matching between a metal layer and an organic layer.

A display device according to additional embodiments is described with reference to FIGS. 6 to 8. FIG. 6 illustrates a cross-sectional view taken along line A-A' of FIG. 1, according to an embodiment. FIG. 7 illustrates a cross-sectional view taken along line A-A' of FIG. 1, according to another embodiment. FIG. 8 is a diagram illustrating a principle of reducing ambient light reflection by using an effect of destructive interference by phase matching between a metal layer and an organic layer.

Referring to FIGS. 6 and 7, an OLED display according to these embodiments may include a dielectric layer 500 on a metal layer 400. As illustrated in FIG. 6, the dielectric layer 500 may be, for example, disposed only on the metal layer 400. As illustrated in FIG. 7, the dielectric layer 500 may be disposed both on the metal layer 400 and a common electrode 730. Phase matching may take place between the dielectric layer 500 and the metal layer 400 such that destructive interference occurs between reflective light of ambient light, thereby increasing light absorption.

The dielectric layer 500 may include an organic material such as a polyacrylate or a polyimide that is the same material as that of the pixel defining layer 190. The dielectric layer 500 may include an inorganic material such as lithium fluoride (LiF), tungsten trioxide ($WO_3$), titanium dioxide ($TiO_2$), aluminum oxide ($Al_2O_3$), zinc oxide (ZnO), zinc sulfide (ZnS), or silver oxide (AgO). The dielectric layer 500 may be formed using a material having a refractive index of about 1 to about 5. The material having a refractive index of about 1 to about 5 may be well phase-matched with the metal layer 400. Light absorption may occur evenly in all wavelengths of ambient light.

The dielectric layer 500 may be formed by the following method. The organic or inorganic material may be coated on the metal layer 400 using thermal deposition, a solution process, or the like. The organic or inorganic material may be exposed to light reusing the mask applied to the exposure of the pixel defining layer 190, and then may be developed so as to form the dielectric layer 500.

The dielectric layer 500 may be formed during the process of forming the pixel defining layer 190 and the metal layer 400. For example, the photosensitive organic material 190a and the photosensitive metal material 400a may be coated, and the organic material included in the dielectric layer 500 may then be coated. The pixel defining layer 190, the metal layer 400, and the dielectric layer 500 may be simultaneously formed through exposure, developing, and curing.

FIG. 8 illustrates a schematic mechanism by which the dielectric layer 500 phase-matched with the metal layer 400 produces destructive interference such that ambient light $L_0$ reflection is reduced. The ambient light $L_0$ may be converted to first reflected light $L_1$ reflected from the dielectric layer 500 and second reflected light $L_2$ reflected from the metal layer 400. There may be a 180 degree phase difference between a phase $\theta_1$ of the first reflected light $L_1$ and a phase $\theta_2$ of the second reflected light $L_2$. The destructive interference may occur due to the phase difference between the first reflected light $L_1$ and the second reflected light $L_2$, and thus light reflected from the pixel defining layer 190 may decrease. Compared to the metal layer 400, a phase $\theta_1$ delay of the first reflected light $L_1$ reflected from the dielectric layer 500 may be adjusted according to a thickness and refractive index of the dielectric layer 500.

By way of summation and review, a display device and a method of manufacturing the same are provided. Further, aspects of embodiments are directed to a display device including a metal layer capable of improving outdoor visibility and reducing or preventing IR drop in a second electrode, and a manufacturing method thereof.

With a recent trend towards large area and high integration of a display device, an IR-drop may occur in a cathode electrode, such as an electric field generating electrode, and the IR-drop may cause luminance non-uniformity in existing display devices. An OLED display may include an anode, which is one of electric field generating electrodes, in a pixel area defined by a pixel defining layer. The pixel defining layer may serve to divide unit pixels from each other. Light incident from the outside of a display device may be partially reflected on the pixel defining layer, thereby considerably reducing outdoor visibility of existing display devices. Further, some of the incident light may also be incident on the pixel defining layer, and may then reflected again on a substrate component (e.g. an anode) on a lower portion of the pixel defining layer. Such a series of events in conventional displays may further reduce the outdoor visibility of the display device. The embodiments described herein may improve outdoor visibility, and reduce or prevent IR drop.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Various changes in form and details may be made without departing from the spirit and scope of the present disclosure as set forth in the following claims.

What is claimed is:

1. A display device, comprising:
    a substrate;
    a first electrode on the substrate;
    a pixel defining layer on the substrate, having an opening exposing the first electrode;
    a metal layer only on the pixel defining layer;
    a light emission layer on the first electrode exposed by the opening; and
    a second electrode on the light emission layer in the opening,
    wherein the metal layer directly contacts the second electrode.

2. The display device as claimed in claim 1, further including a dielectric layer on the metal layer.

3. The display device as claimed in claim 2, wherein the dielectric layer includes at least one of the group of lithium fluoride (LiF), tungsten trioxide ($WO_3$), titanium dioxide ($TiO_2$), aluminum oxide ($Al_2O_3$), zinc oxide (ZnO), zinc sulfide (ZnS), and silver oxide (AgO).

4. The display device as claimed in claim 2, wherein the dielectric layer includes a same material as the pixel defining layer.

5. The display device as claimed in claim 2, wherein the dielectric layer has a refractive index of about 1 to about 5.

6. The display device as claimed in claim 2, wherein the dielectric layer is on the second electrode.

7. The display device as claimed in claim 1, wherein the pixel defining layer includes a protrusion.

8. The display device as claimed in claim 7, wherein the metal layer covers at least one of a top surface and side surfaces of the protrusion.

9. The display device as claimed in claim 1, wherein the metal layer includes at least one of the group of chromium (Cr), molybdenum (Mo), silver (Ag), aluminum (Al), gold (Au), and copper (Cu).

10. The display device as claimed in claim 1, wherein a side of the second electrode directly contacts a side of the metal layer.

11. The display device as claimed in claim 1, wherein the second electrode does not overlap the metal layer.

12. A method of manufacturing a display device, the method comprising:
    forming a first electrode on a substrate;
    forming a pixel defining layer on the substrate, the pixel defining layer having an opening exposing the first electrode;
    forming a metal layer only on the pixel defining layer;
    forming a light emission layer on the first electrode exposed by the opening; and
    forming a second electrode on the light emission layer in the opening, the second electrode directly contacting the metal layer.

13. The method as claimed in claim 12, wherein forming the pixel defining layer and the metal layer includes:
    coating a photosensitive organic material onto the substrate and the first electrode;
    coating a photosensitive metal material onto the photosensitive organic material;
    exposing the photosensitive organic material and the photosensitive metal material to light using a mask;
    forming the pixel defining layer and the opening exposing the first electrode and by developing the exposed photosensitive organic material and photosensitive metal material; and
    forming the metal layer by heat treating the photosensitive metal material.

14. The method as claimed in claim 13, wherein the heat treating is performed at a temperature of about 200° C. to about 300° C.

15. The method as claimed in claim 12, further comprising forming a dielectric layer on the metal layer.

16. The method as claimed in claim 12, further comprising forming a dielectric layer on the metal layer and the second electrode.

17. The method as claimed in claim 15, wherein forming the pixel defining layer, the metal layer, and the dielectric layer includes:
    coating a first photosensitive organic material onto the substrate and the first electrode;
    coating a photosensitive metal material onto the first photosensitive organic material;
    coating a second photosensitive organic material onto the photosensitive metal material;
    exposing the first photosensitive organic material, the photosensitive metal material, and the second photosensitive organic material to light using a mask;
    developing the exposed first photosensitive organic material, photosensitive metal material, and second photosensitive organic material to form the pixel defining layer, the dielectric layer, and the opening exposing the first electrode; and
    forming the metal layer by heat treating the photosensitive metal material.

18. The method as claimed in claim 15, wherein the dielectric layer includes at least one of lithium fluoride (LiF), tungsten trioxide ($WO_3$), titanium dioxide ($TiO_2$), aluminum oxide ($Al_2O_3$), zinc oxide (ZnO), zinc sulfide (ZnS), and silver oxide (AgO).

19. The method as claimed in claim 15, wherein the dielectric layer includes a same material as the pixel defining layer.

20. The method as claimed in claim 12, wherein the metal layer includes at least one of chromium (Cr), molybdenum (Mo), silver (Ag), aluminum (Al), gold (Au), and copper (Cu).

* * * * *